US010727232B2

(12) United States Patent
Kumar et al.

(10) Patent No.: US 10,727,232 B2
(45) Date of Patent: Jul. 28, 2020

(54) DRAM AND METHOD OF MAKING

(71) Applicant: Applied Materials, Inc., Santa Clara, CA (US)

(72) Inventors: Arvind Kumar, Santa Clara, CA (US); Mahendra Pakala, Fremont, CA (US); Sanjeev Manhas, Uttarakhand (IN); Satendra Kumar Gautam, Ghaziabad Uttar Pradesh (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/243,551

(22) Filed: Jan. 9, 2019

(65) Prior Publication Data
US 2020/0144272 A1 May 7, 2020

(30) Foreign Application Priority Data

Nov. 7, 2018 (IN) .............................. 201841042056

(51) Int. Cl.
*H01L 27/108* (2006.01)
*H01L 21/28* (2006.01)
*H01L 29/49* (2006.01)

(52) U.S. Cl.
CPC .. *H01L 27/10876* (2013.01); *H01L 21/28088* (2013.01); *H01L 27/10814* (2013.01); *H01L 27/10823* (2013.01); *H01L 29/4966* (2013.01)

(58) Field of Classification Search
CPC ........... H01L 27/10876; H01L 29/4966; H01L 21/28088; H01L 27/10814; H01L 27/10823
See application file for complete search history.

(56) References Cited

U.S. PATENT DOCUMENTS

| 10,043,811 | B1 | 8/2018 | Tsai et al. |
| 2005/0026382 | A1 | 2/2005 | Akatsu et al. |
| 2006/0172504 | A1 | 8/2006 | Sinitsky et al. |
| 2010/0055856 | A1* | 3/2010 | Hong .................... H01L 21/022 438/239 |

(Continued)

FOREIGN PATENT DOCUMENTS

| CN | 106876319 A | 6/2017 |
| KR | 10-2003-0019250 A | 3/2003 |

OTHER PUBLICATIONS

Search Report dated Feb. 13, 2020 for Application No. PCT/US2019/058802.

*Primary Examiner* — Yasser A Abdelaziez
(74) *Attorney, Agent, or Firm* — Patterson + Sheridan LLP

(57) ABSTRACT

Embodiments of the present disclosure generally relate to a storage device. More specifically, embodiments described herein generally relate to a dynamic random-access memory and the method of making thereof. In one embodiment, a cell array includes at least an active region and a field region adjacent to the active region. The active region includes at least one trench, a dielectric layer disposed in the trench, a first conformal layer disposed on the dielectric layer, and a conductive material disposed on the first conformal layer. The field region includes a trench, a dielectric layer disposed in the trench, a second conformal layer disposed on the dielectric layer, and a conductive material disposed on the second conformal layer. The second conformal layer has a different composition than the first conformal layer.

10 Claims, 10 Drawing Sheets

(56) References Cited

U.S. PATENT DOCUMENTS

| | | |
|---|---|---|
| 2010/0276757 A1 | 11/2010 | Doyle et al. |
| 2017/0084615 A1* | 3/2017 | Lee .................. H01L 21/28088 |
| 2018/0158828 A1* | 6/2018 | Han .................. H01L 21/0217 |
| 2018/0342425 A1* | 11/2018 | Chang ............. H01L 21/823456 |
| 2019/0051652 A1* | 2/2019 | Kim .................. H01L 29/0649 |

* cited by examiner

DRAM AND METHOD OF MAKING

CROSS-REFERENCE TO RELATED APPLICATIONS

This application claims priority to Indian Provisional Patent Application No. 201841042056, filed on Nov. 7, 2018, which herein is incorporated by reference.

BACKGROUND

Field

Embodiments of the present disclosure generally relate to a storage device. More specifically, embodiments described herein generally relate to a dynamic random-access memory and the method of making thereof.

Description of the Related Art

With advances in computing technology, computing devices are smaller and have increased processing power. Accordingly, increased storage and memory is needed to meet the devices' programming and computing needs. The shrinking size of the devices with increased storage capacity is achieved by increase the number of storage units that having smaller geometries.

With the latest generation of increased density of storage cells, intermittent failure has appeared in some devices. Researchers have traced the failures to repeated access to a single row of memory cells within the refresh window of the memory cell. For example, for a 32 nanometer (nm) process, the physical adjacent word line (WL) to the access row has a very high probability of experiencing data corruption. The issue has been labeled as a row hammer failure by the DRAM industry.

The row hammer failure can cause charge migration across the passgate (PG) in the field region to bit line contact through the active region by the repeated access to one row, causing data corruption in a non-accessed physically adjacent row. This condition leads to data bit failure.

Accordingly, an improved DRAM and method for forming the DRAM are needed.

SUMMARY

Embodiments of the present disclosure generally relate to a storage device. More specifically, embodiments described herein generally relate to a dynamic random-access memory (DRAM) and the method of making thereof. In one embodiment, a cell array includes one or more first trenches located in an active region, a first dielectric layer disposed in the one or more first trenches, a first conformal layer disposed on the first dielectric layer, a first conductive material disposed on the first conformal layer, one or more second trenches located in a field region, a second dielectric layer disposed in the one or more second trenches, a second conformal layer disposed on the second dielectric, the second conformal layer having a different composition than the first conformal layer, and a second conductive material disposed on the second conformal layer.

In another embodiment, a method includes depositing a dielectric layer in a first plurality of trenches, the first plurality of trenches including a second plurality of trenches in active regions and a third plurality of trenches in field regions, depositing a first conformal layer on the dielectric layer, depositing a mask on the second plurality of trenches, the third plurality of trenches being exposed, removing the first conformal layer disposed in the third plurality of trenches, depositing a second conformal layer on the dielectric layer in the third plurality of trenches, removing the mask, and depositing a conductive material in the first plurality of trenches.

In another embodiment, a method includes depositing a dielectric layer in a first plurality of trenches, the first plurality of trenches including a second plurality of trenches in active regions and a third plurality of trenches in field regions, depositing a first conformal layer on the dielectric layer, depositing a mask on the second plurality of trenches, the third plurality of trenches being exposed, doping the first conformal layer in the third plurality of trenches to form a second conformal layer in the third plurality of trenches, removing the mask, and depositing a conductive material in the first plurality of trenches.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a storage device. More specifically, embodiments described herein generally relate to a dynamic random-access memory and the method of making thereof. In one embodiment, a cell array includes at least an active region and a field region adjacent to the active region. The active region includes at least one trench, a dielectric layer disposed in the trench, a first conformal layer disposed on the dielectric layer, and a conductive material disposed on the first conformal layer. The field region includes a trench, a dielectric layer disposed in the trench, a second conformal layer disposed on the dielectric layer, and a conductive material disposed on the second conformal layer. The second conformal layer has a different composition from the first conformal layer. The second conformal layer is a work function layer that reduces interference from the neighboring active regions, leading to reduced data bit failure.

Figure 1A:
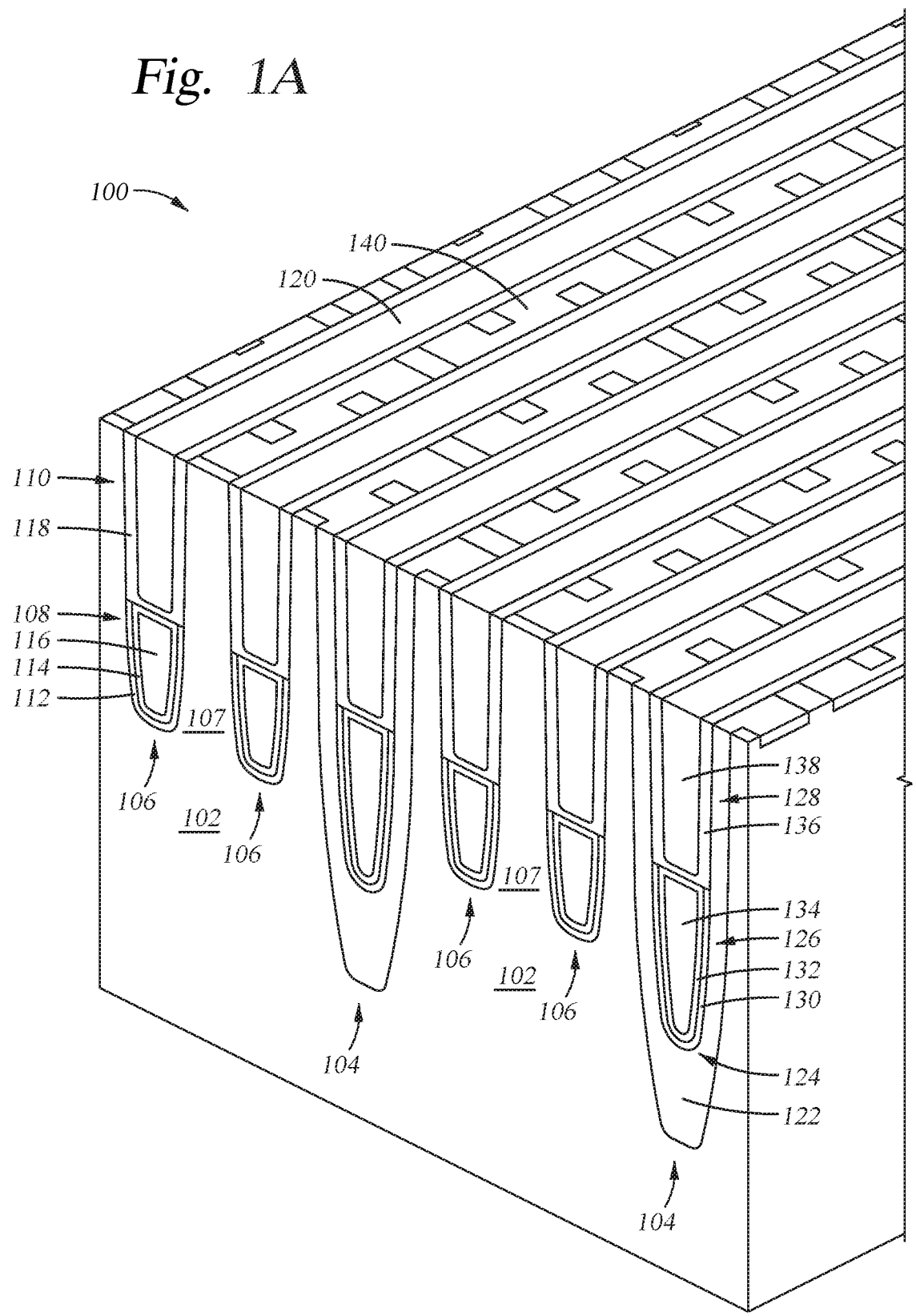
FIG. 1A is a perspective view of a cell array of a DRAM.

FIG. 1A is a perspective view of a cell array 100 of a DRAM according to one embodiment described herein. Bit lines are omitted in FIG. 1A for clarity. The cell array 100 includes a plurality of active regions 102 and a plurality of field regions 104. The active regions 102 and the field regions 104 are alternately positioned. Each active region 102 includes one or more trenches 106 formed in one or more semiconductor materials 107. The semiconductor materials 107 include one or more of silicon, doped silicon, or other suitable semiconductor material. Each trench 106 includes a first portion 108 and a second portion 110. A dielectric layer 112 is disposed on the first portion 108 of the trench 106. The dielectric layer 112 may be an oxide, such as silicon oxide. A conformal layer 114 is disposed on the dielectric layer 112, and a conductive material 116 is disposed on the conformal layer 114. In one embodiment, the conductive material 116 functions as a gate (i.e., buried word line) and is fabricated from an electrically conductive material, such as a metal. In one embodiment, the conformal layer 114 is fabricated from a metal nitride.

A dielectric layer 118 is formed on the second portion 110 of the trench 106. The dielectric layer 118 may be fabricated from the same material as the dielectric layer 112. In one embodiment, the dielectric layer 118 is formed on the side wall of the second portion 110 of the trench 106 and on the dielectric layer 112, the conformal layer 114, and the conductive material 116. A silicon nitride layer 120 is disposed on the dielectric layer 118.

Each field region 104 includes a shallow trench isolation (STI) 122. A trench 124 is formed in the STI 122. The trench 124 includes a first portion 126 and a second portion 128. A dielectric layer 130 is disposed on the first portion 126 of the trench 124. The dielectric layer 130 may be fabricated from the same material as the dielectric layer 112. A conformal layer 132 is disposed on the dielectric layer 130, and a conductive material 134 is disposed on the conformal layer 132. In one embodiment, the conductive material 134 is fabricated from the same material as the conductive material 116. The conformal layer 132 is a work function layer having a different composition than the conformal layer 114. The conformal layer 132 may be fabricated from a metal, doped metal nitride, or other suitable material. The conformal layer 132, which is a work function layer having a different composition than the conformal layer 114 in the active region 102, reduces interference from the neighboring active regions 102, leading to reduced data bit failure.

A dielectric layer 136 is formed on the second portion 128 of the trench 124. The dielectric layer 136 may be fabricated from the same material as the dielectric layer 130. In one embodiment, the dielectric layer 136 is formed on the side wall of the second portion 128 of the trench 124 and on the dielectric layer 130, the conformal layer 132, and the conductive material 134. A silicon nitride layer 138 is disposed on the dielectric layer 136. In one embodiment, the active regions 102 include a row of transistors (i.e., the conductive material 116 functioning as gates), and the row of transistors is separated from another row of transistors by a dielectric material 140. In one embodiment, the dielectric material 140 is silicon nitride.

Figure 1B:
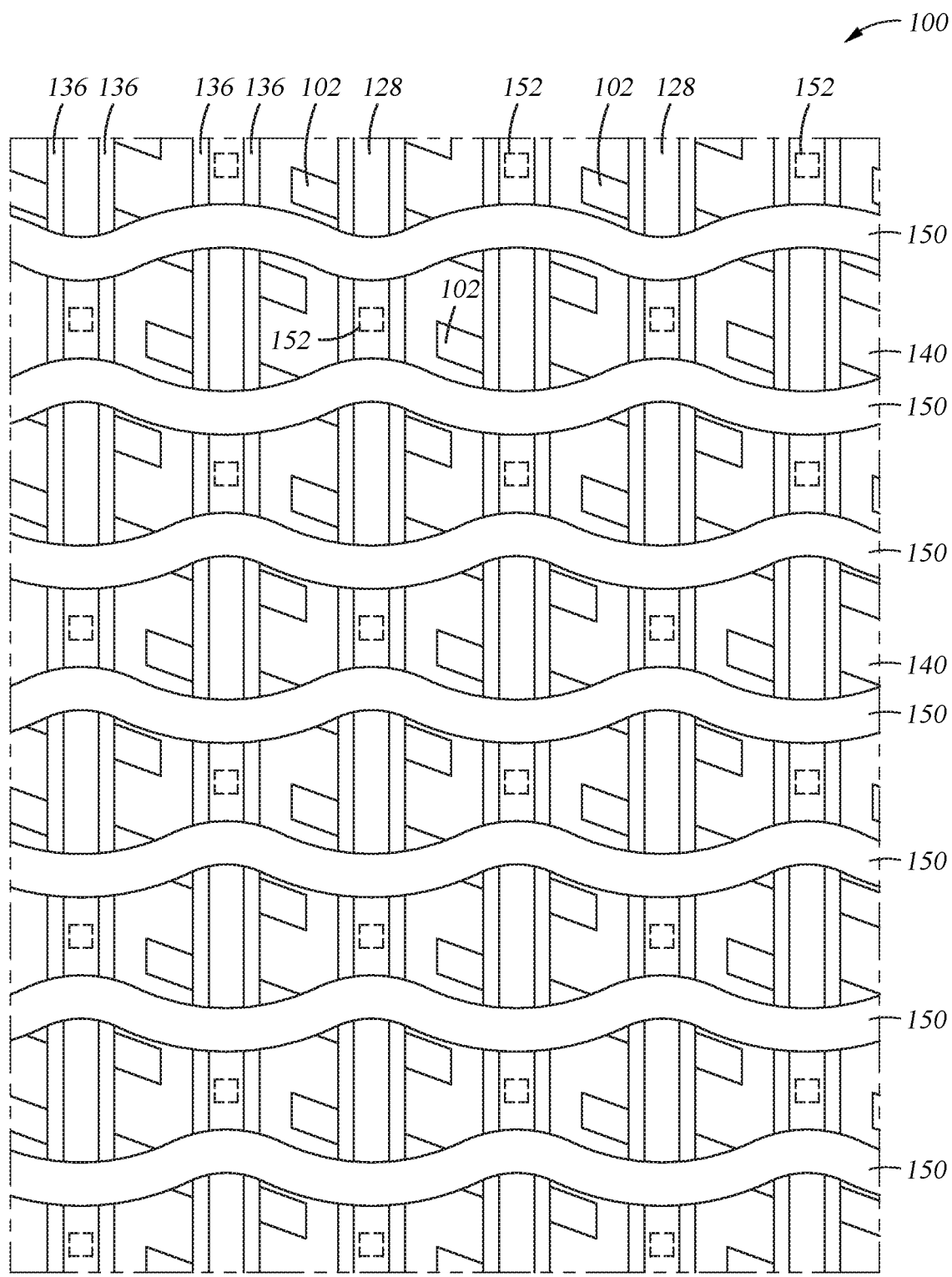
FIG. 1B is a top view of the cell array of FIG. 1A.

FIG. 1B is a top view of the cell array 100 of FIG. 1A according to one embodiment described herein. As shown in FIG. 1B, the cell array 100 includes a plurality of bit lines 150 disposed over the dielectric layer 136, the silicon nitride layer 138, and the dielectric material 140. The cell array 100 further includes a plurality of active regions 102 and a plurality of field regions 104. Each filed region 104 is disposed between two active regions 102. The region 152 in the field region 104 represents the location of the trench 124 including the conformal layer 132. The conformal layer 132, which is a work function layer, reduces interference from the neighboring active regions 102, leading to reduced data bit failure.

Figure 2:
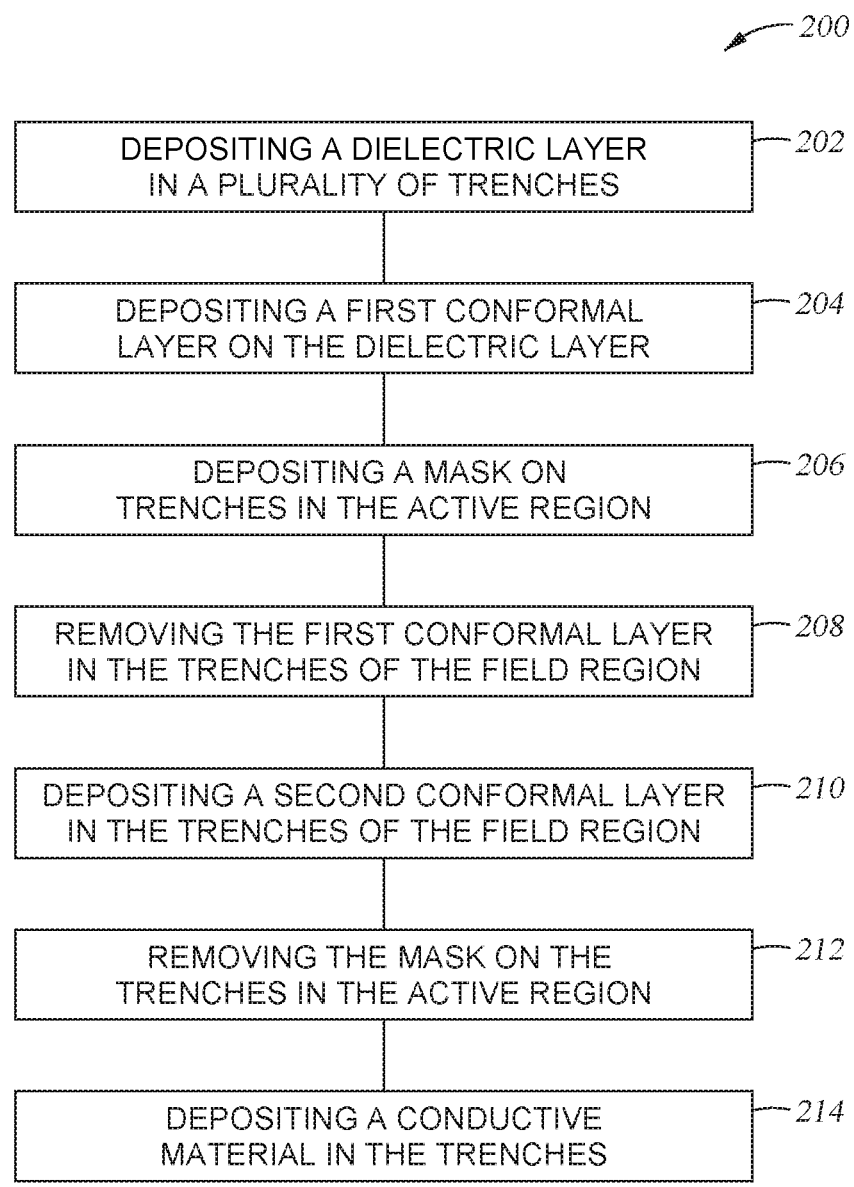
FIG. 2 is a flow diagram of a method for forming the cell array of FIG. 1A.
Figure 3A:
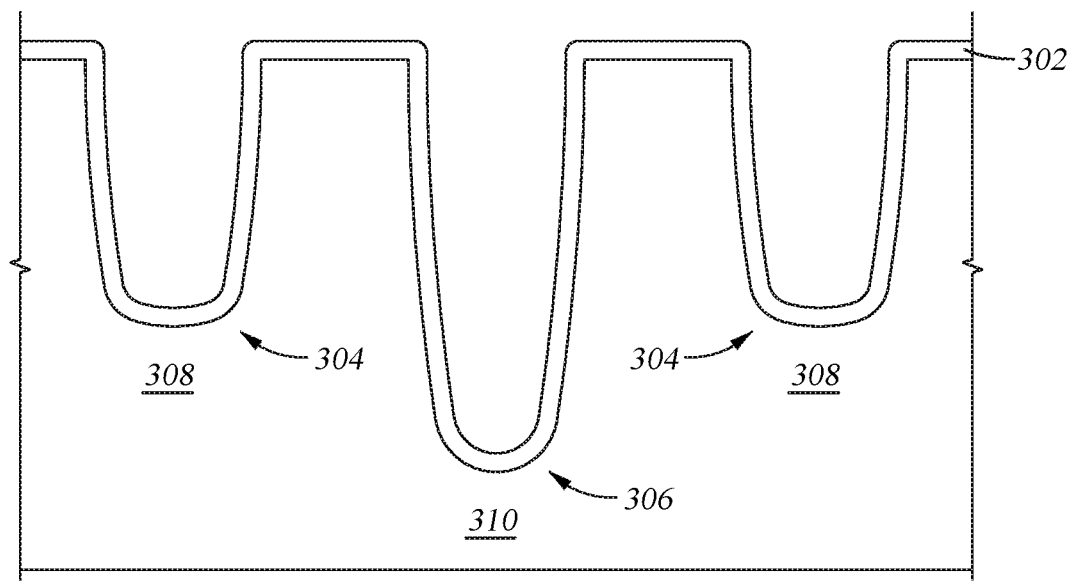
FIGS. 3A-3G illustrate schematic cross-sectional views of a portion of the cell array of FIG. 1A during different stages of the method of FIG. 2.

FIG. 2 is a flow diagram of a method 200 for forming the cell array 100 of FIG. 1A. FIGS. 3A-3G illustrate schematic cross-sectional views of a portion of the cell array 100 of FIG. 1A during different stages of the method of FIG. 2. The method 200 starts at operation 202 by depositing a dielectric layer 302 in a plurality of trenches 304, 306, as shown in FIG. 3A. The trenches 304 are located in active regions 308, and the trench 306 is located in the field region 310. The active regions 308 may be the active regions 102 of the cell array 100 as shown in FIG. 1A, and the field region 310 may be the field region 104 of the cell array as shown in FIG. 1A. The trenches 304 may be the trenches 106 of the cell array 100 as shown in FIG. 1A, and the trench 306 may be the trench 124 of the cell array 100 as shown in FIG. 1A. The dielectric layer 302 may be the same as the dielectric layers 112, 118, 130, 136 of the cell array 100 as shown in FIG. 1A. The dielectric layer 302 may be deposited by any suitable method. In one embodiment, the dielectric layer 302 is a conformal layer that is deposited by an atomic layer deposition (ALD) process.

Figure 3B:
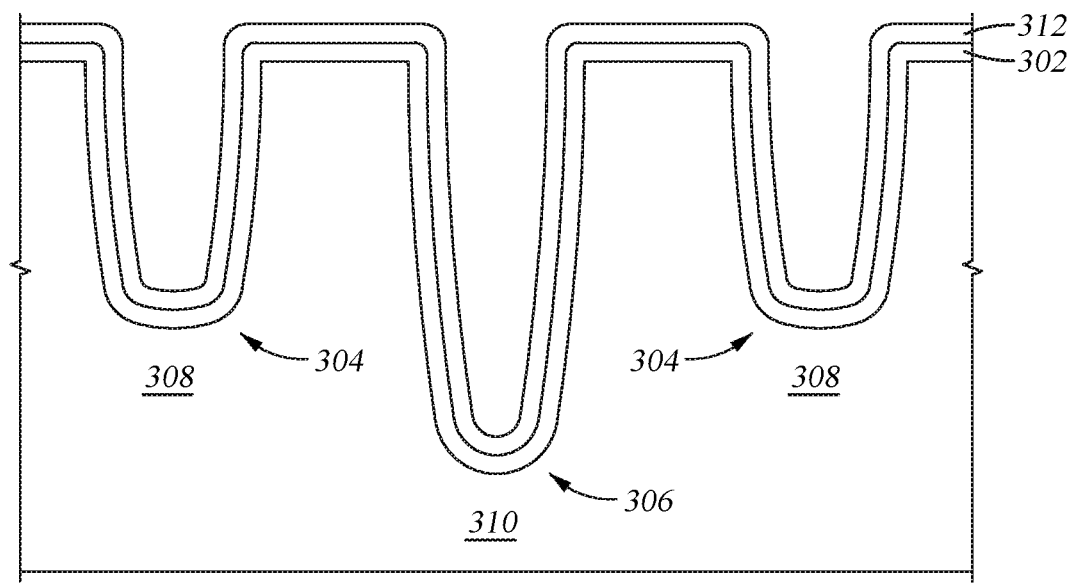
Figure 3C:
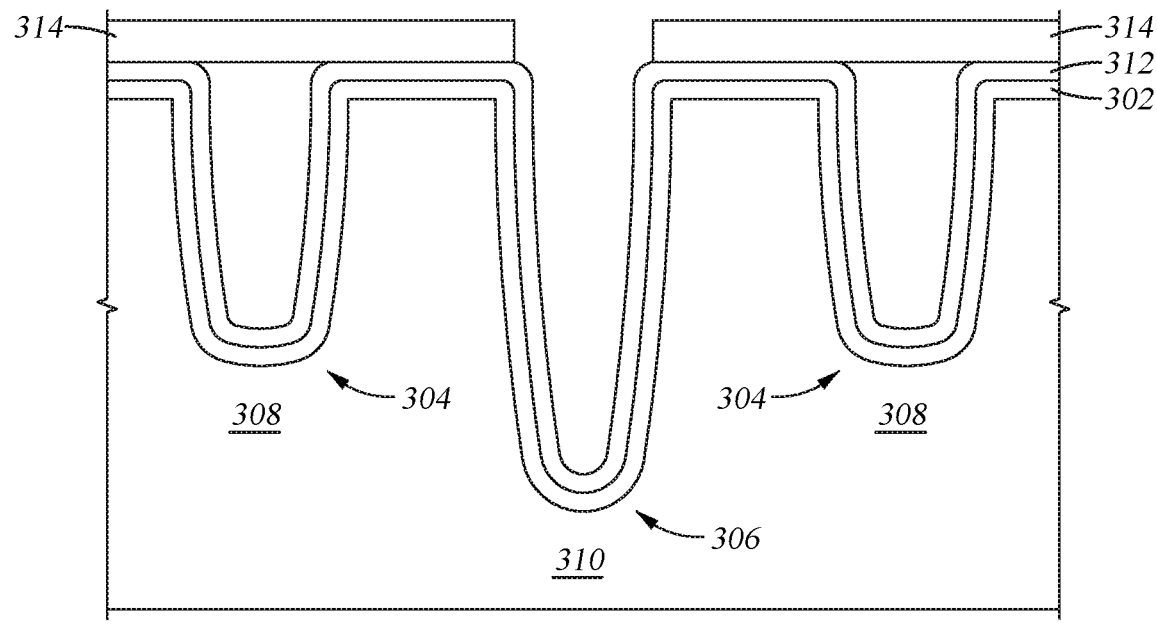

Next, at operation 204, a first conformal layer 312 is deposited on the dielectric layer 302, as shown in FIG. 3B. The first conformal layer 312 may be the conformal layer 114 of the cell array 100 as shown in FIG. 1A. The first conformal layer 312 may be deposited by any suitable method. In one embodiment, the first conformal layer 312 is a metal nitride layer that is deposited by an ALD process. At operation 206, a mask 314 is deposited on trenches 304 in the active regions 308, as shown in FIG. 3C. The mask 314 may be any suitable mask. In one embodiment, the mask 314 is a photoresist. In one embodiment, the mask is a multi-layer structure. The mask 314 covers the trenches 304 of the active regions 308, while the trench 306 of the field region 310 is exposed.

Figure 3D:
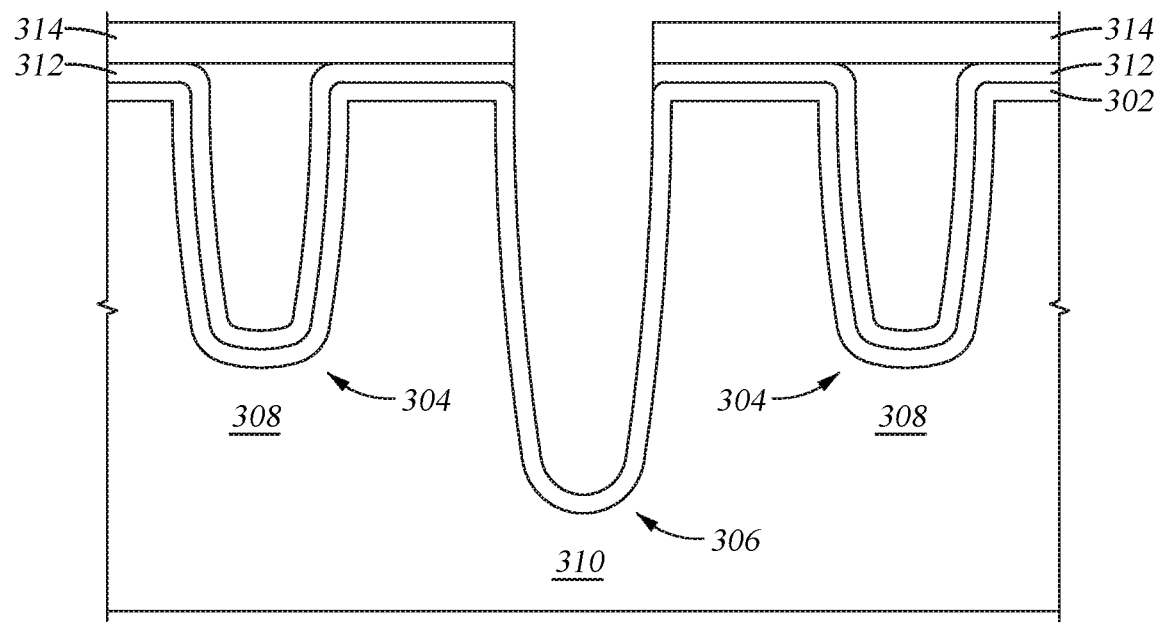
Figure 3E:
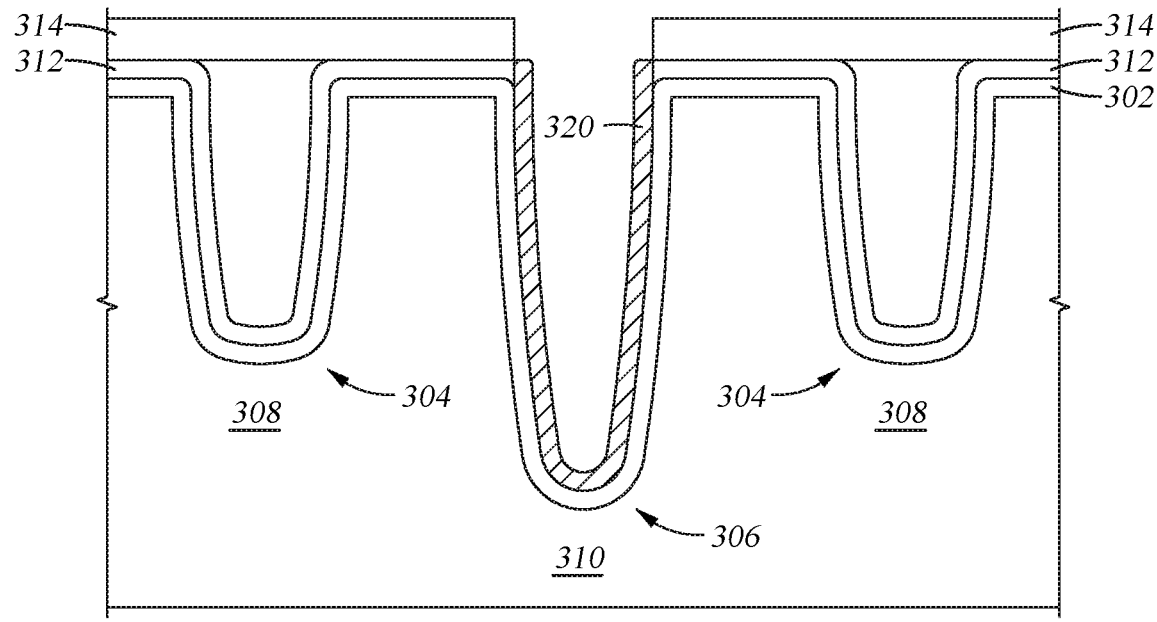

At operation 208, the first conformal layer 312 disposed of the trench 306 in the field region 310 is removed, as shown in FIG. 3D. The removal of the first conformal layer 312 in the trench 306 may be achieved by any suitable method. In one embodiment, the removal of the first conformal layer 312 in the trench 306 is achieved by wet etching. Next, at operation 210, a second conformal layer 320 is deposited in the trench 306 of the field region 310, as shown in FIG. 3E. The second conformal layer 320 may be any layer that has a different composition than the first conformal layer 312. The second conformal layer 320 is a work function layer. The second conformal layer 320 may be the same as the conformal layer 132. In one embodiment, the second conformal layer 320 is deposited by an ALD process.

Figure 3F:
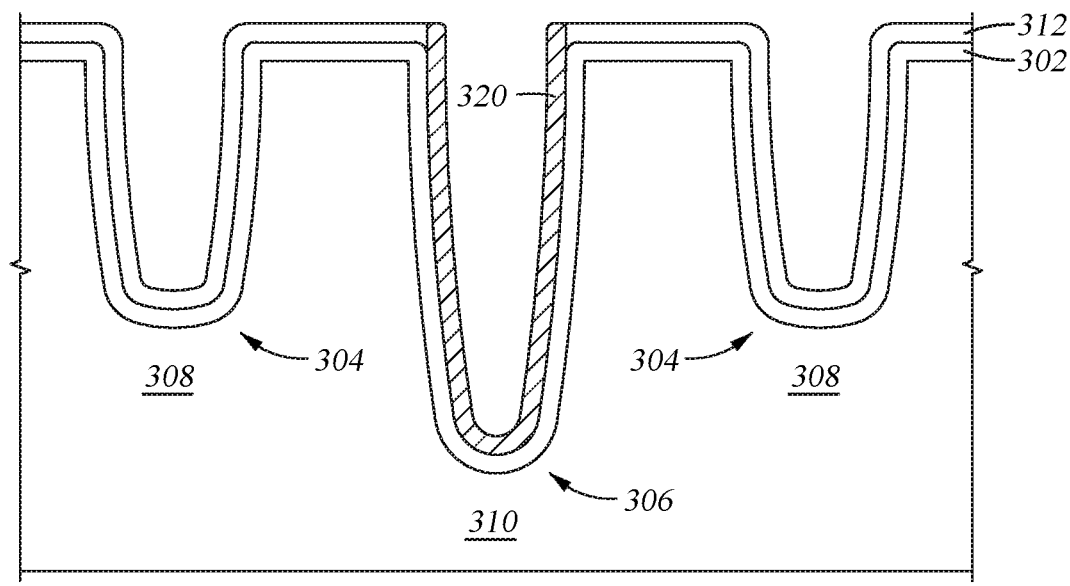
Figure 3G:
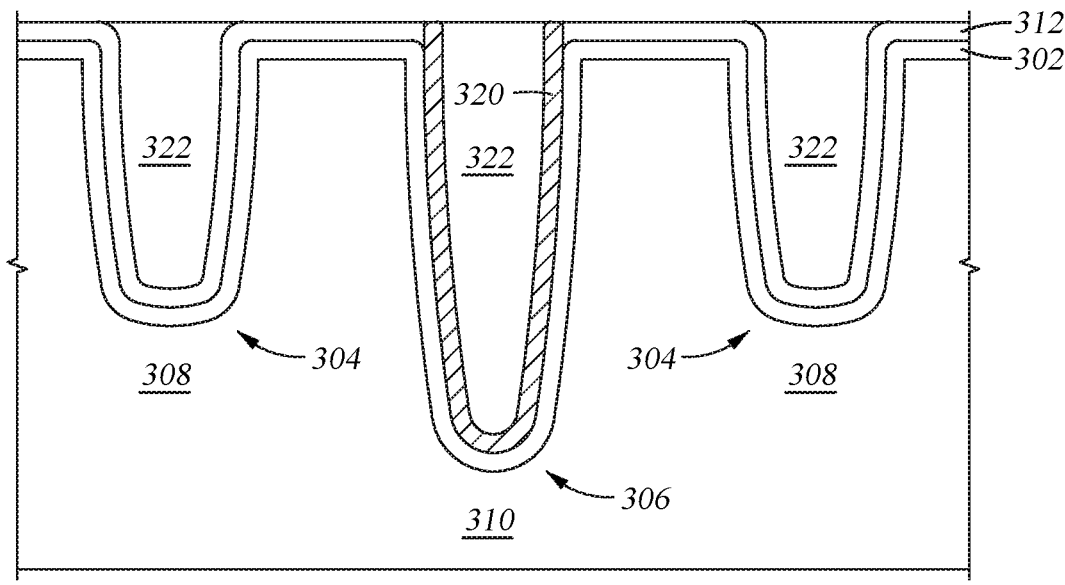

At operation 212, the mask 314 disposed on the trenches 304 of the active regions 308 is removed, as shown in FIG. 3F. The mask 314 may be removed by any suitable process. In one embodiment, the mask 314 is removed by a stripping process. Next, at operation 214, a conductive material 322 is deposited in the trenches 304, 306, as shown in FIG. 3G. The conductive material 322 may be the same as the conductive material 116, 134 of the cell array 100 as shown in FIG. 1A. The conductive material 322 may be deposited by any suitable method. In one embodiment, the conductive material 322 is deposited by a chemical vapor deposition (CVD) process.

Figure 4:
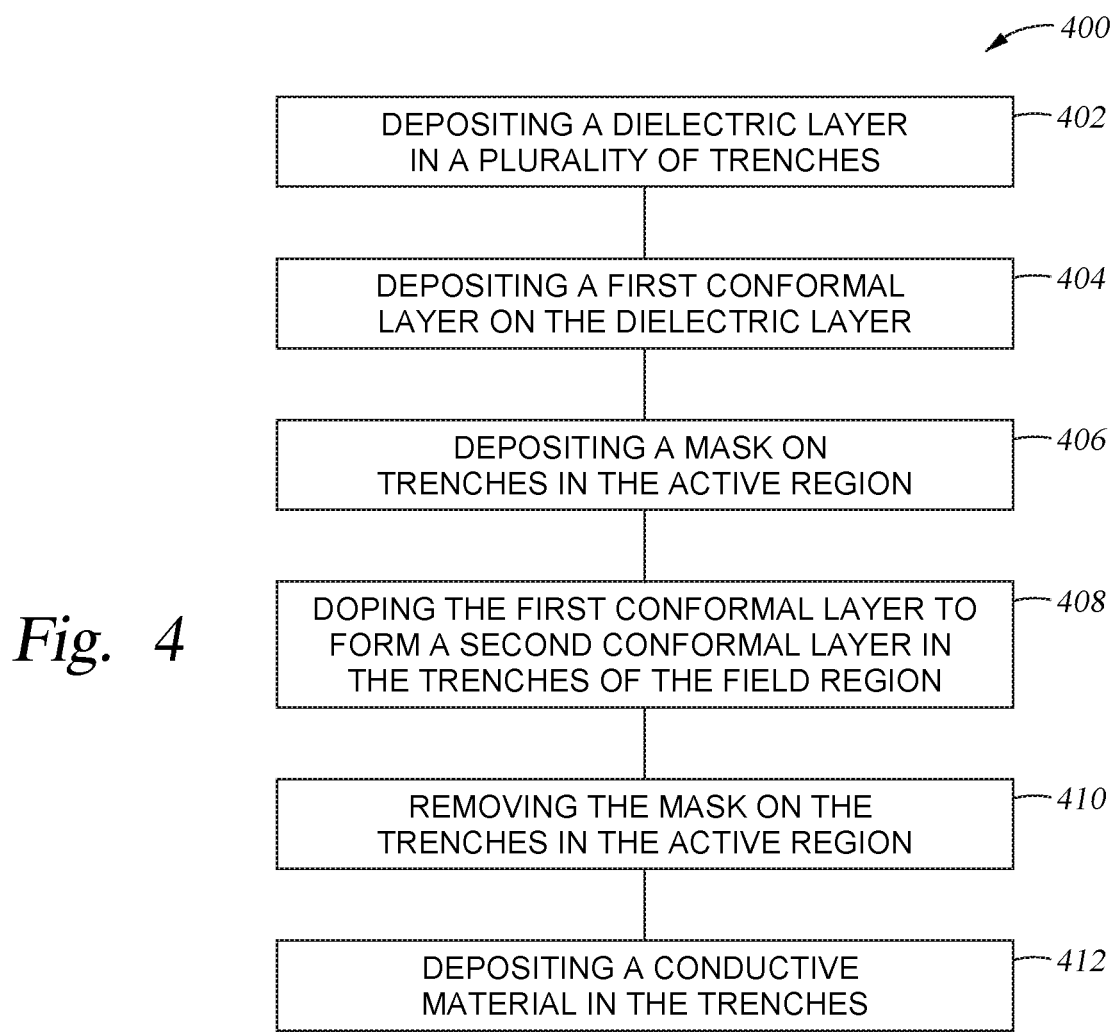
FIG. 4 is a flow diagram of a method for forming the cell array of FIG. 1A.
Figure 5A:
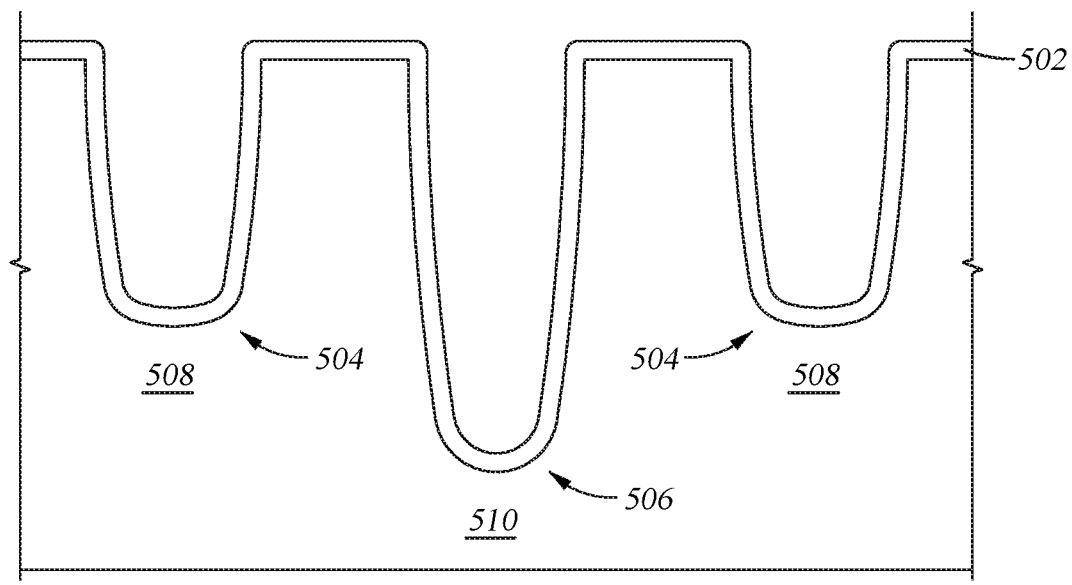
FIGS. 5A-5F illustrate schematic cross-sectional views of a portion of the cell array of FIG. 1A during different stages of the method of FIG. 4.

FIG. 4 is a flow diagram of a method 400 for forming the cell array 100 of FIG. 1A. FIGS. 5A-5F illustrate schematic cross-sectional views of a portion of the cell array 100 of FIG. 1A during different stages of the method of FIG. 4. The method 400 starts at operation 402 by depositing a dielectric layer 502 in a plurality of trenches 504, 506, as shown in FIG. 5A. The trenches 504 are located in active regions 508, and the trench 506 is located in the field region 510. The active regions 508 may be the active regions 102 of the cell array 100 as shown in FIG. 1A, and the field region 510 may be the field region 104 of the cell array as shown in FIG. 1A. The trenches 504 may be the trenches 106 of the cell array 100 as shown in FIG. 1A, and the trench 506 may be the trench 124 of the cell array 100 as shown in FIG. 1A. The dielectric layer 502 may be the same as the dielectric layers 112, 118, 130, 136 of the cell array 100 as shown in FIG. 1A. The dielectric layer 502 may be deposited by any suitable method. In one embodiment, the dielectric layer 502 is a conformal layer that is deposited by an ALD process.

Figure 5B:
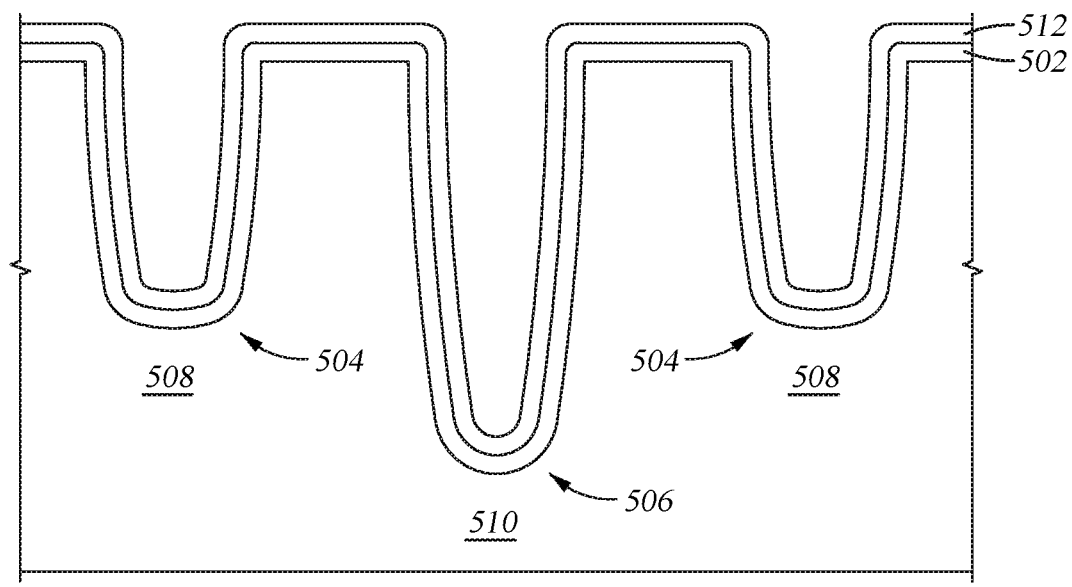
Figure 5C:
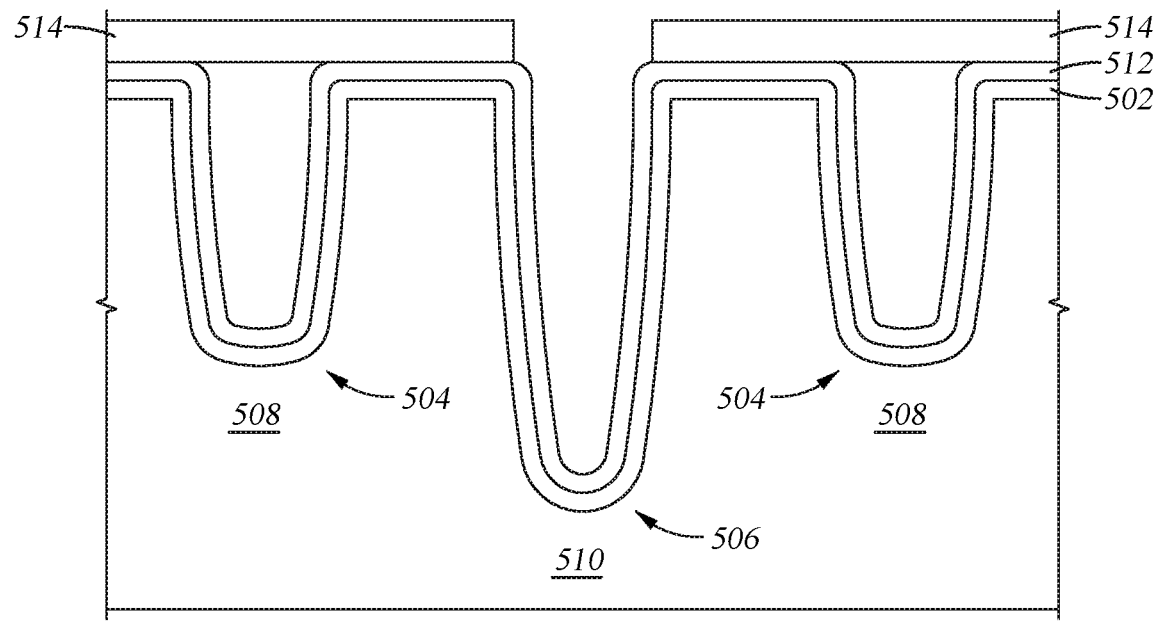

Next, at operation 404, a first conformal layer 512 is deposited on the dielectric layer 502, as shown in FIG. 5B. The first conformal layer 512 may be the conformal layer 114 of the cell array 100 as shown in FIG. 1A. The first conformal layer 512 may be deposited by any suitable method. In one embodiment, the first conformal layer 512 is a metal nitride layer that is deposited by an ALD process. At operation 406, a mask 514 is deposited on trenches 504 in the active regions 508, as shown in FIG. 5C. The mask 514 may be any suitable mask. In one embodiment, the mask 514 is a photoresist mask. In one embodiment, the mask is a multi-layer structure. The mask 514 covers the trenches 504 of the active regions 508, while the trench 506 of the field region 510 is exposed.

Figure 5D:
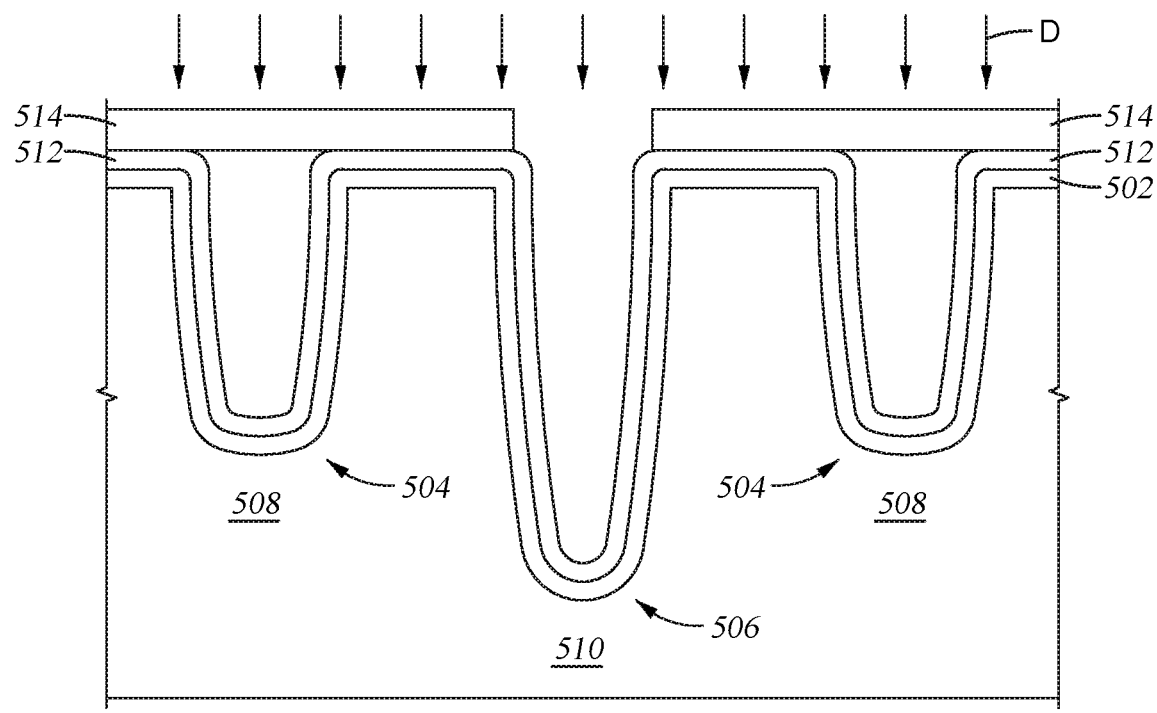

At operation 408, the first conformal layer 512 disposed of the trench 506 in the field region 510 is doped with a dopant D to form a second conformal layer 520, as shown in FIG. 5D. The dopant D may be any suitable dopant. As a result, the first conformal layer 512 is disposed in each trench 304 of the active region 308, while the second conformal layer 520 is disposed in each trench 306 of the field region 310. The second conformal layer 520 has a different composition than the first conformal layer 512, since the second conformal layer 520 includes the dopant compared to the first conformal layer 512.

Figure 5E:
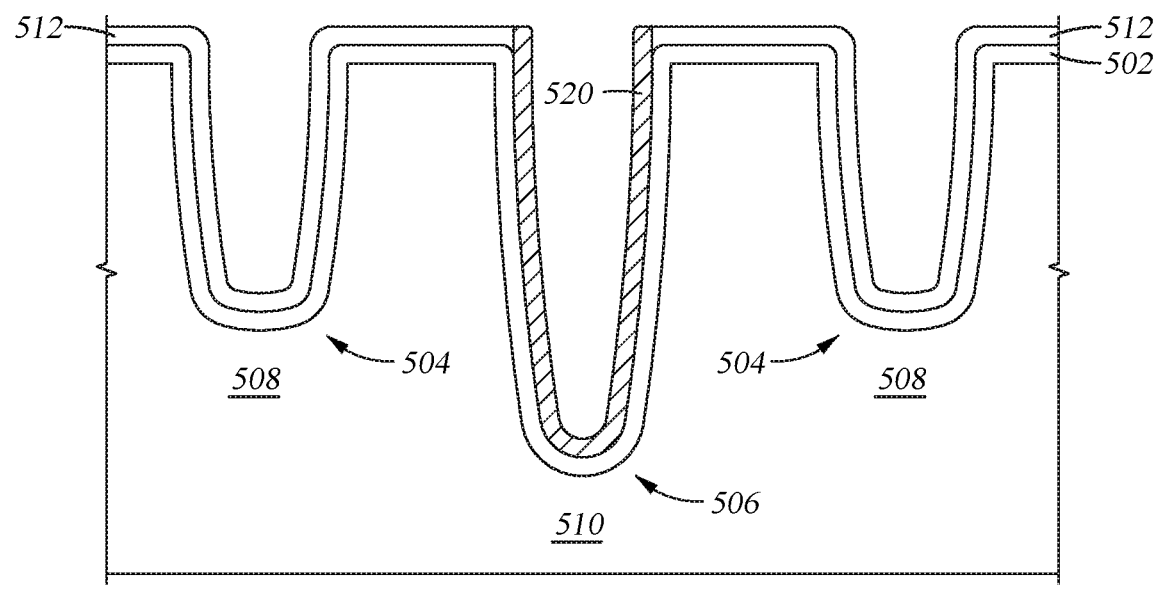
Figure 5F:
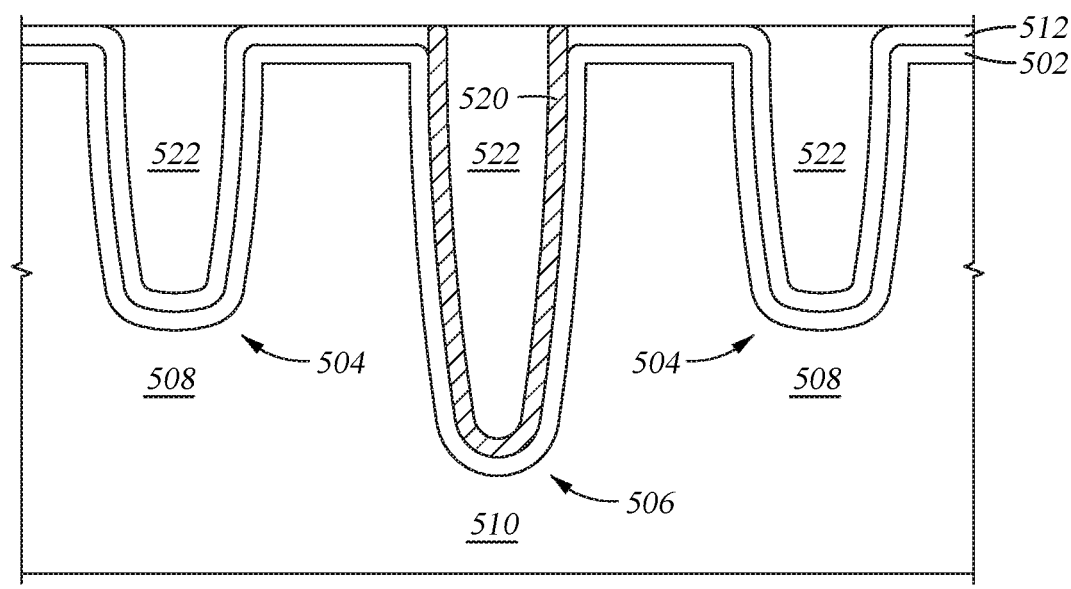

At operation 410, the mask 514 disposed on the trenches 504 of the active regions 508 is removed, as shown in FIG. 5E. The mask 514 may be removed by any suitable process. In one embodiment, the mask 514 is removed by a stripping process. Next, at operation 412, a conductive material 522 is deposited in the trenches 504, 506, as shown in FIG. 5F. The conductive material 522 may be the same as the conductive material 116, 134 of the cell array 100 as shown in FIG. 1A. The conductive material 522 may be deposited by any suitable method. In one embodiment, the conductive material 522 is deposited by a CVD process.

The DRAM including the cell array, such as the cell array 100, having a work function layer, such as the conformal layers 132, 320, 520, disposed in trenches of the field region reduces interference from the neighboring active regions, leading to reduced data bit failure. The cell array may have 4F2 cell structure, 6F2 cell structure, 8F2 cell structure, or other suitable cell structure. The cell array may be utilized in other access devices, such as FinCAT and nanowire devices.

While the foregoing is directed to embodiments of the present disclosure, other and further embodiments of the disclosure may be devised without departing from the basic scope thereof, and the scope thereof is determined by the claims that follow.

What is claimed is:

1. A cell array, comprising:
   one or more first trenches located in an active region;
   a first dielectric layer disposed in the one or more first trenches;
   a first conformal layer disposed on the first dielectric layer in the one or more first trenches, the first conformal layer comprising a first material;
   a first conductive material disposed on and in direct contact with the first conformal layer in the one or more first trenches;
   one or more shallow trench isolations located in a field region;
   one or more second trenches located in the one or more shallow trench isolations;
   a second dielectric layer disposed in the one or more second trenches;
   a second conformal layer disposed on the second dielectric layer in the one or more second trenches, the second conformal layer comprising the first material doped with one or more dopants; and
   a second conductive material disposed on and in direct contact with the second conformal layer in the one or more second trenches.

2. The cell array of claim 1, wherein the first dielectric layer is an oxide layer.

3. The cell array of claim 2, wherein the first material is metal nitride.

4. The cell array of claim 3, wherein the first conductive material and the second conductive material are a metal.

5. The cell array of claim 1, wherein the second dielectric layer is an oxide layer.

6. A cell array, comprising:
   a pair of first trenches located in an active region, wherein the active region is disposed between a pair of adjacent field regions each having a shallow trench isolation therein;
   a first dielectric layer disposed on each of the first trenches;
   a first conformal layer disposed on the first dielectric layer, the first conformal layer comprising a first material;
   a first conductive material disposed on and in direct contact with the first conformal layer;
   a second trench located in each of the shallow trench isolations;
   a second dielectric layer disposed on the second trench;
   a second conformal layer disposed on the second dielectric layer in the second trench, the second conformal layer comprising the first material doped with one or more dopants; and
   a second conductive material disposed on and in direct contact with the second conformal layer in the second trench.

7. The cell array of claim 6, wherein the first dielectric layer is an oxide layer.

8. The cell array of claim 6, wherein the second dielectric layer is an oxide layer.

9. The cell array of claim 6, wherein the first material is metal nitride.

10. The cell array of claim 6, wherein the first conductive material and the second conductive material are a metal.

* * * * *